(12) United States Patent
Tavassoli et al.

(10) Patent No.: US 7,450,384 B2
(45) Date of Patent: Nov. 11, 2008

(54) CARD CAGE WITH PARALLEL FLOW PATHS HAVING SUBSTANTIALLY SIMILAR LENGTHS

(75) Inventors: Kamran Tavassoli, Bedford, NH (US); Paul J. Porreca, Marlboro, MA (US); Robert C. Sullivan, Stow, MA (US)

(73) Assignee: Hybricon Corporation, Ayer, MA (US)

( * ) Notice: Subject to any disclaimer, the term of this patent is extended or adjusted under 35 U.S.C. 154(b) by 0 days.

(21) Appl. No.: 11/469,713

(22) Filed: Sep. 1, 2006

(65) Prior Publication Data

US 2008/0007913 A1 Jan. 10, 2008

Related U.S. Application Data

(60) Provisional application No. 60/818,849, filed on Jul. 6, 2006.

(51) Int. Cl.
*H05K 7/20* (2006.01)
*F28F 7/00* (2006.01)

(52) U.S. Cl. .................. 361/699; 165/80.4; 361/689

(58) Field of Classification Search ......... 361/688–689, 361/698–699
See application file for complete search history.

(56) References Cited

U.S. PATENT DOCUMENTS

| | | | |
|---|---|---|---|
| 3,579,821 A | 5/1971 | Kurisu | |
| 3,631,325 A | 12/1971 | Wenz | |
| 3,754,596 A | 8/1973 | Ward | |
| 3,865,183 A * | 2/1975 | Roush | 165/80.4 |
| 3,918,084 A | 11/1975 | Schierz | |
| 4,006,388 A * | 2/1977 | Bartholomew | 361/691 |
| 4,079,410 A | 3/1978 | Schierz | |
| 4,120,021 A | 10/1978 | Roush | |
| 4,268,850 A | 5/1981 | Lazarek | |
| 4,493,010 A | 1/1985 | Morrison | |
| 4,538,675 A * | 9/1985 | Welsh | 165/80.4 |
| 4,777,561 A * | 10/1988 | Murphy et al. | 361/700 |
| 4,829,402 A * | 5/1989 | Gewebler et al. | 361/692 |
| 4,884,168 A | 11/1989 | August | |
| 4,958,257 A * | 9/1990 | Wenke | 361/700 |
| 4,962,444 A * | 10/1990 | Niggemann | 361/702 |
| 4,965,699 A | 10/1990 | Jorden | |
| 5,016,090 A | 5/1991 | Galyon | |
| 5,057,968 A | 10/1991 | Morrison | |
| 5,079,619 A | 1/1992 | Davidson | |
| 5,099,311 A | 3/1992 | Bonde | |
| 5,111,280 A | 5/1992 | Iversen | |

(Continued)

FOREIGN PATENT DOCUMENTS

EP 014249 B1 9/1982

*Primary Examiner*—Gregory D Thompson
(74) *Attorney, Agent, or Firm*—Mills & Onello LLP

(57) ABSTRACT

A card cage configured to hold a set of electronics cards comprises a set of walls having an input and an output and a set of flow paths formed in the set of walls to enable a fluid to flow therein. The set of flow paths includes a first flow path formed between the input and the output and in first wall from the set of walls and a second flow path formed between the input and the output and in a second wall from the set of walls. The first flow path and the second flow path are substantially the same length and a fluid flowing therein experiences substantially the same pressure drop.

28 Claims, 16 Drawing Sheets

U.S. PATENT DOCUMENTS

| | | | |
|---|---|---|---|
| 5,170,319 A | 12/1992 | Chao-Fan Chu | |
| 5,203,399 A | 4/1993 | Koizumi | |
| 5,214,564 A * | 5/1993 | Metzler et al. | 361/699 |
| 5,309,320 A | 5/1994 | Smith | |
| 5,329,425 A | 7/1994 | Leyssens | |
| 5,406,807 A | 4/1995 | Ashiwake | |
| 5,424,916 A * | 6/1995 | Martin | 361/698 |
| 5,453,911 A | 9/1995 | Wolgemuth | |
| 5,587,880 A | 12/1996 | Phillips | |
| 5,666,269 A | 9/1997 | Romero | |
| 5,737,186 A | 4/1998 | Fuesser | |
| 5,763,951 A | 6/1998 | Hamilton | |
| 5,825,621 A * | 10/1998 | Giannatto et al. | 361/701 |
| 5,880,931 A * | 3/1999 | Tilton et al. | 361/690 |
| 5,953,930 A | 9/1999 | Chu | |
| 5,954,127 A | 9/1999 | Chrysler | |
| 5,960,861 A | 10/1999 | Price | |
| 6,026,565 A * | 2/2000 | Giannatto et al. | 29/830 |
| 6,031,751 A | 2/2000 | Janko | |
| 6,055,157 A | 4/2000 | Bartilson | |
| 6,169,247 B1 * | 1/2001 | Craft et al. | 174/15.1 |
| 6,223,810 B1 | 5/2001 | Chu | |
| 6,305,180 B1 | 10/2001 | Miller | |
| 6,324,058 B1 | 11/2001 | Hsiao | |
| 6,393,853 B1 | 5/2002 | Vukovic | |
| 6,457,514 B1 | 10/2002 | Fumi | |
| 6,536,510 B2 | 3/2003 | Khrustalev | |
| 6,616,469 B2 | 9/2003 | Goodwin | |
| 6,619,044 B2 | 9/2003 | Batchelor | |
| 6,655,449 B1 | 12/2003 | Hsien | |
| 6,661,658 B2 | 12/2003 | Capriz | |
| 6,675,875 B1 | 1/2004 | Vafai | |
| 6,694,809 B2 | 2/2004 | Porter | |
| 6,796,372 B2 * | 9/2004 | Bear | 165/104.21 |
| 6,882,533 B2 | 4/2005 | Bash | |
| 6,903,929 B2 | 6/2005 | Prasher | |
| 6,934,154 B2 | 8/2005 | Prasher | |
| 6,935,412 B2 | 8/2005 | Mueller | |
| 6,957,550 B2 | 10/2005 | Wyatt | |
| 6,994,829 B2 | 2/2006 | Whyatt | |
| 7,000,691 B1 | 2/2006 | Weber | |
| 7,011,146 B2 | 3/2006 | Wong | |
| 7,017,655 B2 | 3/2006 | Wilson | |
| 7,044,199 B2 | 5/2006 | Thayer | |
| 7,059,390 B2 | 6/2006 | Laurila | |
| 7,068,507 B2 | 6/2006 | Pfeifer | |
| 2002/0011330 A1 | 1/2002 | Insley | |
| 2007/0125519 A1 * | 6/2007 | Zoodsma | 165/80.4 |
| 2007/0133171 A1 * | 6/2007 | Cheon | 361/699 |

\* cited by examiner

CARD CAGE WITH PARALLEL FLOW PATHS HAVING SUBSTANTIALLY SIMILAR LENGTHS

This application claims the benefit of priority under 35 U.S.C. §119(e) from commonly owned U.S. provisional patent application Ser. No. 60/818,849, entitled High Performance, Low Pressure Drop, Liquid Cooled (HPLP) Card Cage, filed Jul. 6, 2006.

FIELD OF THE INVENTION

The present inventive concepts relate to the field of card cage assemblies for maintaining electronics cards for operational purposes. More specifically, the present invention relates to card cages for maintaining electronics cards and to the systems used to keep such cards cool.

BACKGROUND

Racks of electronics cards have been in use for quite some time. The applications for such cards are diverse. As examples, cards can function as servers, data storage devices, communications processors and so on. Within a rack, there may be several card cage assemblies, each having a card cage within which a set of cards can be installed. The card cage typically has card slots formed therein to facilitate ease of card installation and to maintain the cards in a stable spaced relationship with respect to other cards in the same card cage. The card cage assemblies are installed in the rack to be removable and the cards are installed within a card cage to also be removable. This facilitates easy card installation, maintenance and testing.

Racks and card cage assemblies provide an efficient way of storing cards in an operational configuration. It is an object of such devices, therefore, to achieve a high degree of density of cards within a rack—and thus within a card cage. In doing so, the number of racks can be minimized and the physical space needed to store the racks will consequently be minimized.

Because cards include electronic components, they generate heat when in operation. However, many of the electronic components on the cards are adversely affected by heat, so must be maintained in a relatively cool state to mitigate the risk of malfunctioning. For this reason, rooms housing racks will typically be temperature controlled, and can also be humidity controlled.

While climate control of the room is useful, it does not adequately address the risk of high temperatures within the card cage, where significant heat is generated. As a result, approaches to cooling the rack and the card cages have been used. For example, some card cages use convection cooling, where air is flowed through or around portions of the card cage. If fans are used, then the fans also become sources of heat and consumers of power. This approach, therefore, has its drawbacks.

Another approach to cooling a card cage is through the use of liquid cooling. One type of liquid cooled card cage assembly is a conduction cooled circuit card assembly (CCA) as defined in IEEE Std 1101.2-1992, as well as other standards, such as VITA 48.2. These CCAs are equipped with a conduction plate. The conduction plate is a thermally conductive, typically metallic plate that conducts heat from CCA components to the edge of the CCA. This plate is secured through two wedge clamps in its location within the card cage. The conducted heat from the conduction plate transfers through the wedge clamps to the card guide integrated into the sidewall of the card cage. The heat load of the card cage introduced by the CCA is removed by convection to flowing liquid in the liquid cooled card cage. Channels for liquid flow are integrated into the walls of the card cage, as described above.

In a commonly designed liquid cooled card cage, the coolant starts from one side of the card cage and flows through each of the sidewalls and exits at the same side of the card cage. To increase the surface area, the liquid channels are narrow and small. This common shape of liquid cooled card cage causes very high pressure drop, in a range between 10 to 20 pounds per square inch (psi) for moderate flow rates of about 0.2 to 1 gallons per minute (gpm). A high pressure drop causes non-uniform heat transfer across the card cage, which is undesirable. The liquid channels in such CCAs tend to have many turns, which results in a relatively high flow resistance. Consequently, the energy needed to flow the coolant is also relatively high.

SUMMARY OF INVENTION

In accordance with one aspect of the present disclosure, provided is a card cage configured to hold a set of electronics cards. The card cage comprises: a set of walls having an input configured to receive a fluid and an output configured as a fluid exit; a set of flow paths formed in the set of walls to enable a fluid to flow therein, the set of flow paths including: a first flow path formed between the input and the output and in at least a portion of a first wall from the set of walls; and a second flow path formed between the input and the output and in at least a portion of a second wall from the set of walls, wherein the first flow path and the second flow path are substantially the same length.

The first flow path and the second flow path can be formed to cause substantially the same pressure drop when the fluid is flowed therein.

The first flow path and the second flow path can form parallel fluid paths.

The first flow path and the second flow path can each comprise multiple channels.

The card cage can be a high performance, low pressure drop liquid cooled card cage.

The card cage can further comprise a return channel formed between the first flow path and the outlet and the second flow path and the outlet.

A supply manifold can be formed at the input. The supply manifold can be configured to substantially equally divide the fluid between the first flow path and the second flow path.

A collector manifold can be formed at the output.

The set of walls can be configured to couple to a motherboard comprising a set of card connectors configured to mate with the set of electronics cards.

The first fluid flow path and the second fluid flow path can each extend through a plurality of walls from the set of walls.

The fluid can be chosen from a group comprising air, inert gas, and a coolant liquid.

The card cage can further comprise at least one of embedded tubing, extruded channels, etched channels, machined channels, machined fins and folded fins formed within the first flow path and the second flow path.

In accordance with another aspect of the present invention, provided is a high performance, low pressure drop liquid cooled card cage comprising: a set of walls configured to form an enclosure; an input and an output formed in at least one wall from the set of walls; a motherboard including a set of card connectors configured to engage electronics cards, the motherboard and set of walls arranged to maintain the electronics cards within the enclosure; and a set of flow paths formed in the set of walls. The set of flow paths includes: a first flow path formed between the input and the output and in at least a portion of a first wall of the set of walls, the first wall disposed in parallel with the card connectors; and a second flow path formed between the input and the output and in at least a portion of a second wall, the second wall disposed in parallel with the card connectors, wherein the first flow path and the second flow path are substantially the same length and are formed such that a liquid flowing therein experiences substantially the same pressure drop in the first flow path as it does in the second flow path.

The first flow path and the second flow path can each comprise multiple parallel channels.

The card cage can further comprise a return channel formed between the first flow path and the output and the second flow path and the output.

A supply manifold can be formed at the input. The supply manifold can be configured to substantially equally divide the liquid between the first flow path and the second flow path.

A collector manifold can be formed at the output.

The card cage can further comprise at least one of embedded tubing, extruded channels, etched channels, machined channels, machined fins and folded fins within the first flow path and the second flow path.

The liquid can be chosen from a group comprising water, glycol, polyalphaolefin, light mineral oils, fluorochemicals, high flash-point fuels, or some combination thereof.

The set of walls can include four walls and the first flow path and the second flow path are each formed within at least two parallel sidewalls from the four walls.

In accordance with yet another aspect of the present invention, provided is a method of cooling a card cage comprising a set of walls forming an enclosure, the method comprising: receiving a fluid at an input; dividing and flowing the fluid between a first flow path and a second flow path having substantially the same length, wherein at least a portion of the first flow path is formed in a first wall from the set of walls and at least a portion of the second flow path is formed in a second wall from the set of walls; and recombining and outputting the fluid at an output.

The first flow path and the second flow path can form parallel fluid paths.

The method can include maintaining substantially the same pressure drop in the first flow path and the second flow path.

The first flow path and the second flow path can each comprise multiple channels and the method can further comprise dividing the fluid in the first flow path among the first flow path multiple channels and dividing the fluid in the second flow path among the second flow path multiple channels.

The fluid can be chosen from a group comprising air, inert gas, and a coolant liquid.

The method can further comprise providing at least one of embedded tubing, extruded channels, etched channels, machined channels, machined fins and folded fins within the first flow path and the second flow path.

BRIEF DESCRIPTION OF THE DRAWINGS

The drawing figures depict preferred embodiments by way of example, not by way of limitations. In the figures, like reference numerals refer to the same or similar elements.

DETAILED DESCRIPTION OF PREFERRED EMBODIMENTS

It will be understood that although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 1:
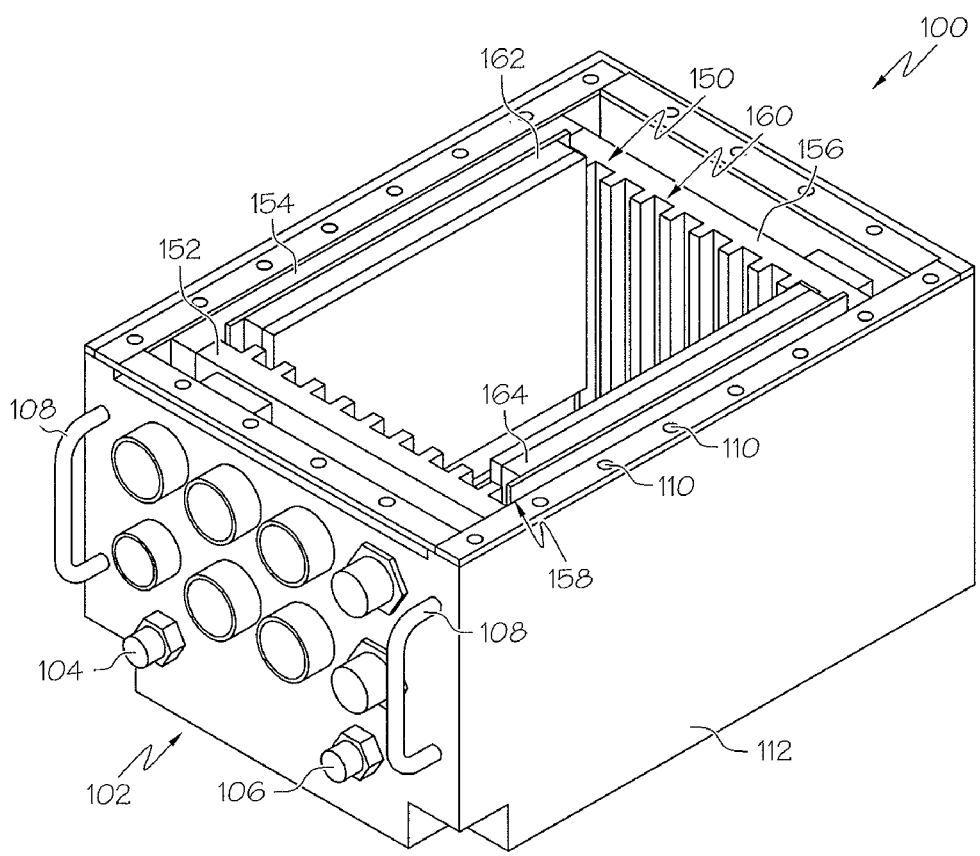
FIG. 1 is a front perspective view of a card cage in accordance with aspects of the present invention.

FIG. 1 is a front perspective view of an embodiment of a card cage assembly 100 in accordance with various aspects of the present invention. In this embodiment the card cage assembly 100 is a conduction cooled card cage assembly (CCA). CCA 100 includes a card cage 150 that forms an enclosure within which a set of electronics cards can be maintained. In this embodiment the card cage 150 is a high performance, low pressure drop (HPLP) liquid cooled card cage.

A front panel 102 of CCA 100 includes an inlet 104 and an outlet 106 and a set of handles 108 for installing and removing the CCA. Inlet 104 provides an input mechanism for providing a liquid, such as a coolant, to multiple parallel flow paths formed within walls of the card cage 150. Once the liquid is circulated through the flow paths, outlet 106 provides a mechanism to discharge the coolant from the set of flow paths. A cover plate 112 is attached to the side of CCA 100, which can be secured to the card cage 150. In completed form, CCA 100 typically also includes a cover or plate across the top thereof (not shown), which can be secured by peripheral fasteners 110.

Card cage 150 includes four walls in the illustrative embodiment: a front wall 152, a first sidewall 154, a rear wall 156, and a second sidewall 158. In this embodiment, front wall 152 and rear wall 156 have card slots formed therein, e.g., card slot 160 in rear wall 156. These card slots form a card guide in the walls of the card cage. Collectively, this set of walls 152, 154, 156, and 158 forms an enclosure configured to maintain electronics cards (not shown) installed within the card slots. A motherboard (see item 200 of FIG. 2A) disposed across the bottom of the card cage typically includes connectors to which the electronics cards can mate when installed in the card slots.

Within the card cage 150, two power supplies 162 and 164 can be added. Power supply 162 is installed adjacent to first sidewall 154 and oriented to ensure thermal coupling between the two. Similarly, power supply 164 is installed adjacent to second sidewall 158. In this embodiment, power supplies 162, 164 are conduction cooled modules that conduct heat from the power supply's electronic components to the edges of the card cage 150.

Figure 2A:
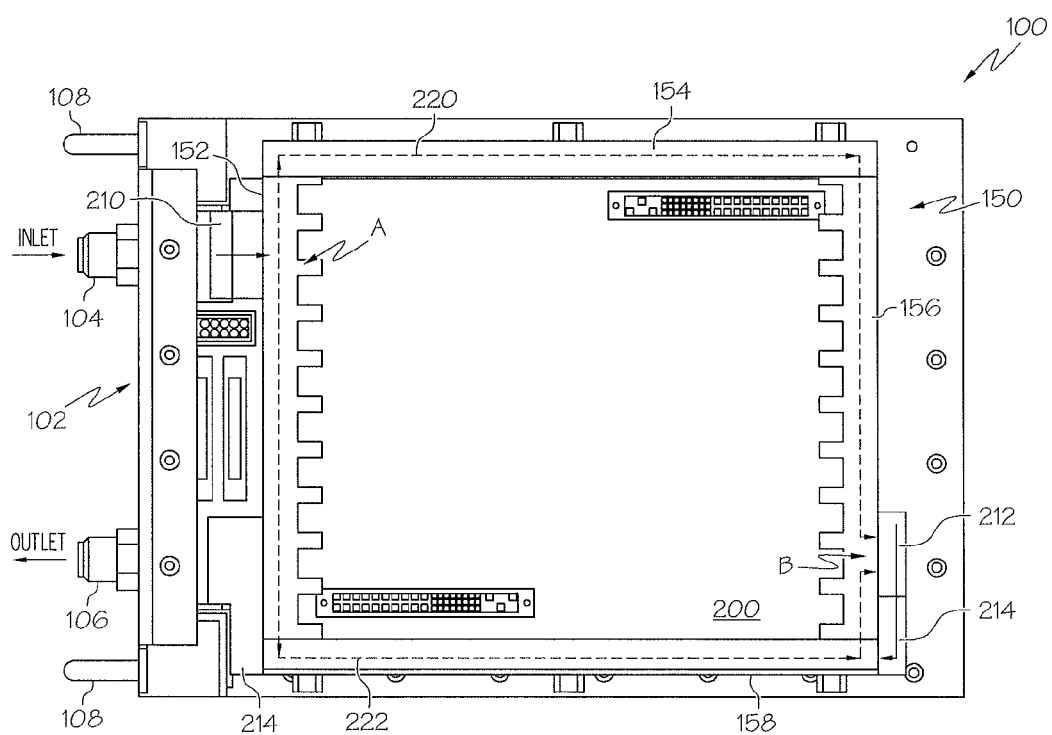
FIG. 2A is a top view of the card cage assembly of FIG. 1.

FIG. 2A is a top view of the CCA 100 of FIG. 1, with a top plate or cover removed. Motherboard 200 is secured across the bottom of card cage 150, as noted above. No electronics cards are shown in the card slots of card cage 150, but they could be added. And power supplies 162 and 164 have been omitted for clarity.

From the view of FIG. 2A, the flow of liquid coolant through the parallel flow paths of the HPLP liquid cooled card cage 150 can be appreciated. The liquid coolant can be water, glycol polyalphaolefin, light mineral oils, fluorochemicals, high flash-point fuels, or any other coolant liquid known in the art. In the present embodiment, the coolant liquid enters the card cage at a supply manifold 210 close to one card cage corner proximate to inlet 104. The liquid splits into two parallel flow paths formed in walls 152, 154, 156, and 158 and rejoins at a diagonally opposite point of card cage 150 at a collector manifold 212. The parallel flow paths have substantially identical lengths and, hence, substantially identical pressure drops. The rejoined liquid at the collector manifold 212 is directed to outlet 106 via a return channel 214, which is separate from the first and second flow paths. Use of a common return channel 214 enables flexibility in the location of the outlet, since the parallel first and second flow paths continue to have substantially identical lengths, independent of the placement of outlet 106. In other embodiments, parallel return channels could be used. In such embodiments, there could be a separate collector manifold for each return channel. The equal lengths of the first and second flow paths should be maintained and the parallel return channels preferably also have substantially the same lengths.

More specifically, in this embodiment, a coolant liquid enters inlet 104 of front panel 102 and passes to supply manifold 210 as an input of the first flow path and the second flow path formed within the set of walls 152, 154, 156, and 158 of card cage 150. The input is located at point "A" in FIG. 2A. The liquid enters card cage 150 at point A and splits between the first and second flow paths. The liquid exits the first and second flow paths at an output represented by a point B at the collector manifold 212. Return channel 214 is coupled to collector manifold 212 and receives the output liquid from the first and second flow paths, and directs the output liquid to outlet 106.

The first flow path is formed between points A and B (i.e., from supply manifold 210 and collector manifold 214) and, in this embodiment, is formed in a small portion of wall 152, the full length of wall 154, and most of wall 156. The second flow path is also formed between points A and B and, in this embodiment, is formed in most of wall 152, the full length of wall 158 and a small portion of wall 156. Dashed line 220 indicates the liquid flow path in the first flow path. And dashed and dotted line 222 indicates the liquid flow in the second flow path.

As is illustrated in FIG. 2A, the length of the first flow path and the length of the second flow path are substantially the same. That is, the distance from supply manifold 210 to the collector manifold 212 is substantially the same whether traveling in the first flow path via wall 154 or traveling in the second flow path via wall 158. In addition to having substantially the same length, the first and second flow paths are also formed to be substantially the same in other dimensions to achieve substantially the same low pressure drop within the first and second flow paths.

The input of the first and second flow paths and the output of the first and second flow paths could be oriented at different locations in the card cage 150, but the equal lengths of the multiple parallel flow paths (e.g., the first and second flow paths above) should be maintained. Also, it will be appreciated by those skilled in the art, the first flow path and the second flow path could each be comprised of multiple parallel channels. It should also be understood that more than two parallel flow paths could be used. As an example, there could be a first flow path and a second flow path in parallel in wall 154 and a third flow path and a fourth flow path in parallel in wall 158. There is no inherent limit on the number of parallel flow paths that could be used in a card cage.

Figure 2B:
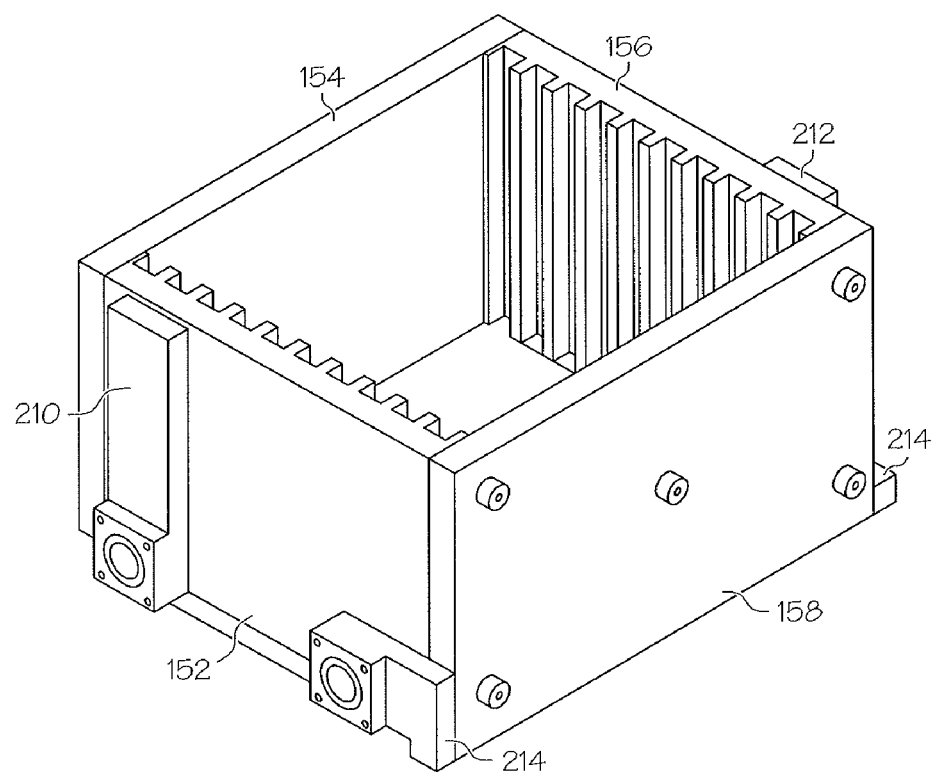
FIG. 2B is a perspective view of only the card cage.

FIG. 2B is a perspective view of card cage 150 only. In this view, walls 152, 154, 156, and 158 are clearly shown, as is supply manifold 210. And portions of the collector manifold 212 and return channel 214 are also shown. The following is a more detailed discussion of these elements in accordance with this embodiment.

Figure 3A:
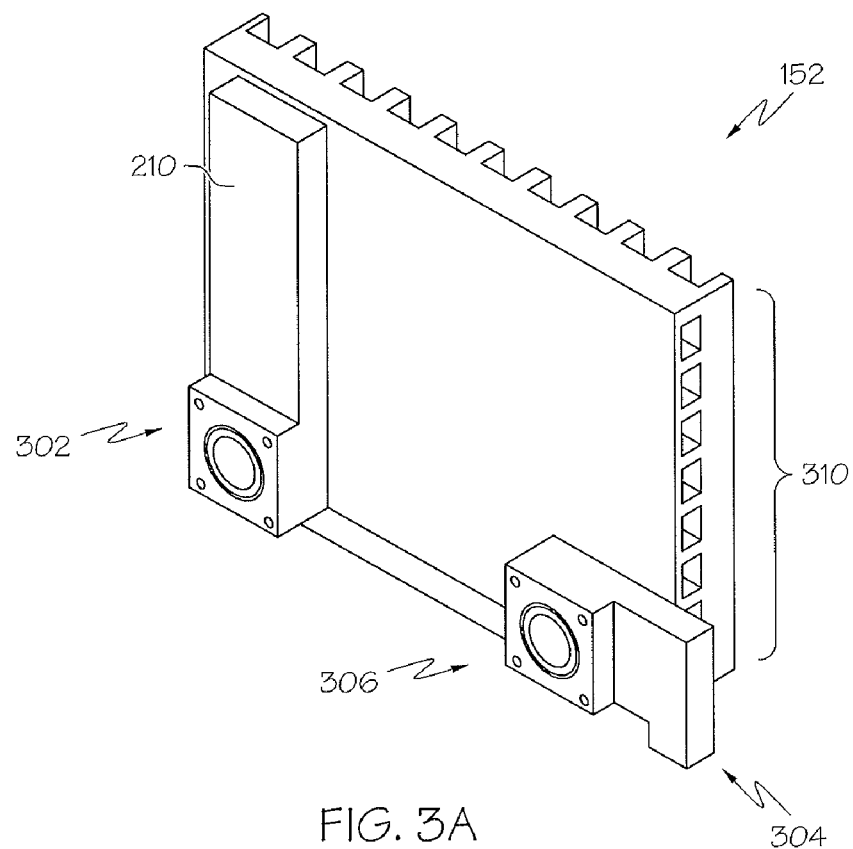
FIGS. 3A-3E are views of a front wall of the card cage of FIG. 1.
Figure 3B:
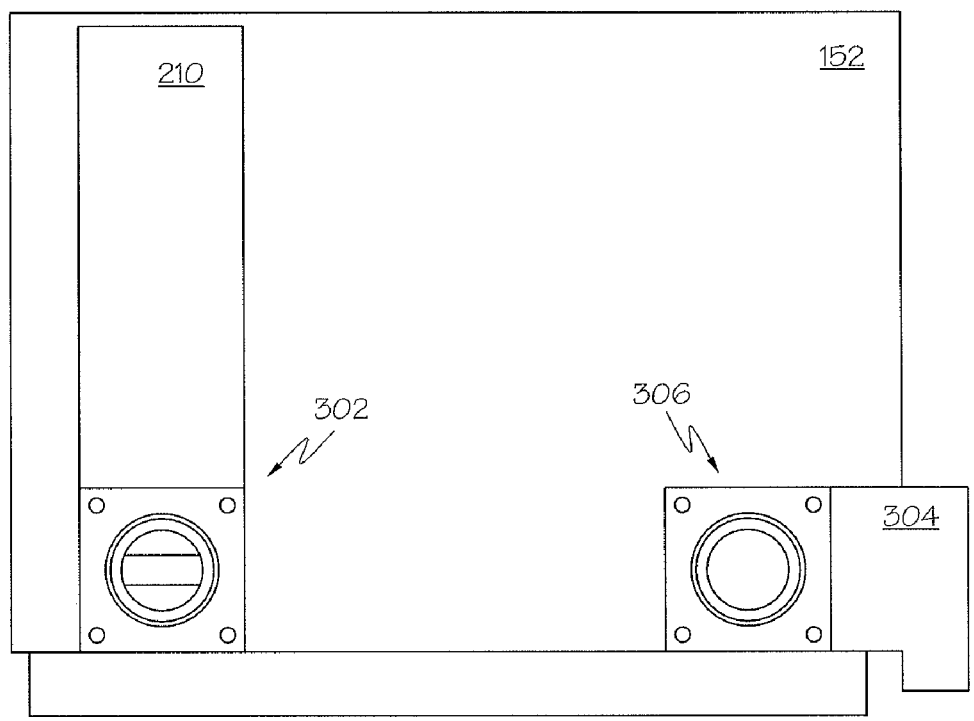

FIGS. 3A-3E show different views of an embodiment of front wall 152, which is made of aluminum in the present embodiment. FIG. 3A is a perspective view of the front of front wall 152. FIG. 3B is a front view of the front wall, and shows substantially the same features as shown in FIG. 3A, but from a different angle. Front panel 152 includes the supply manifold 210 which includes an inlet port 302, to which the inlet 104 (not shown) is coupled. Thus, coolant liquid flows into supply manifold 210 via inlet port 302. Supply manifold 210 then delivers the liquid to the first and second flow paths. In FIG. 3A's perspective view, openings 310 of the second flow path formed in front wall 152 are shown. These openings 310 of the second flow path align with corresponding portions of the second flow path in the second sidewall 158, as will be discussed hereinafter.

FIG. 3A also shows a return end 304 that forms part of the return channel 214. The return end includes an outlet port 306 to which outlet 106 couples to discharge the liquid from the card cage 150, as is also shown in FIG. 3B.

Figure 3C:
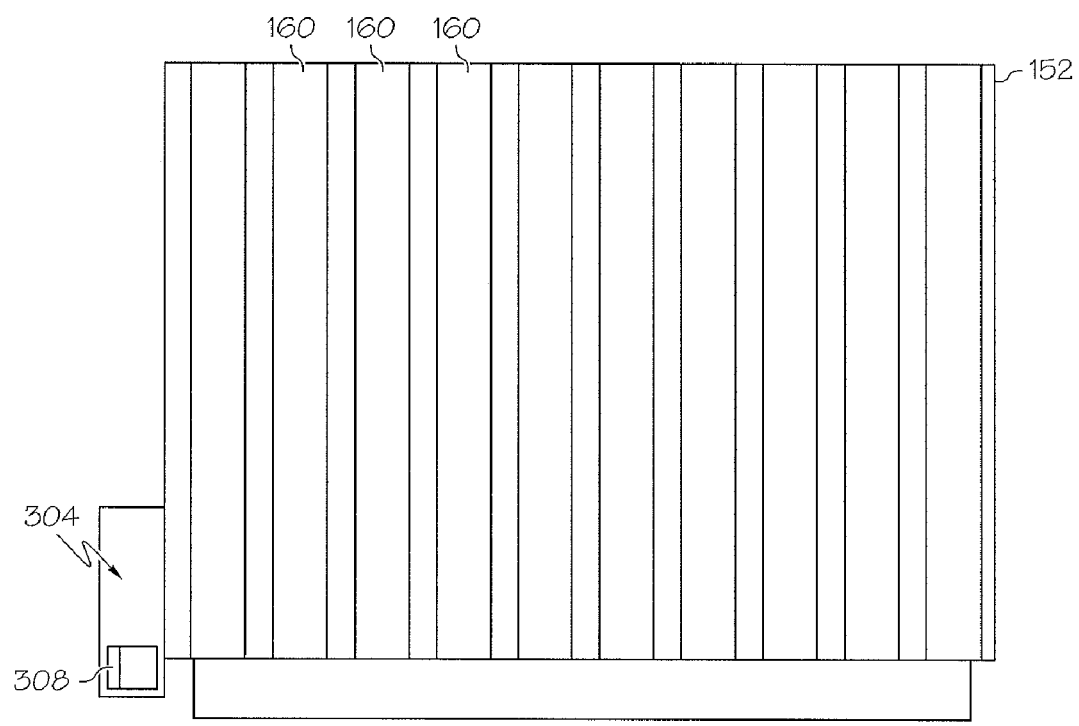

FIG. 3C is a rear view of front wall 152. Card slots 160 are formed in the wall to accommodate the installation of electronics cards. Corresponding card slots are also formed in the rear wall 156. The return end 304 includes an opening that mates with the return path 214 to receive the liquid for discharge.

Figure 3D:
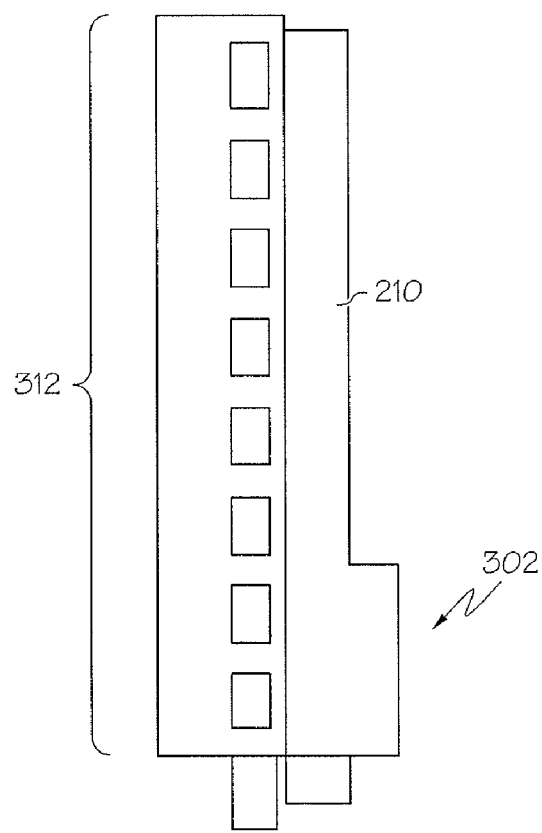
Figure 3E:
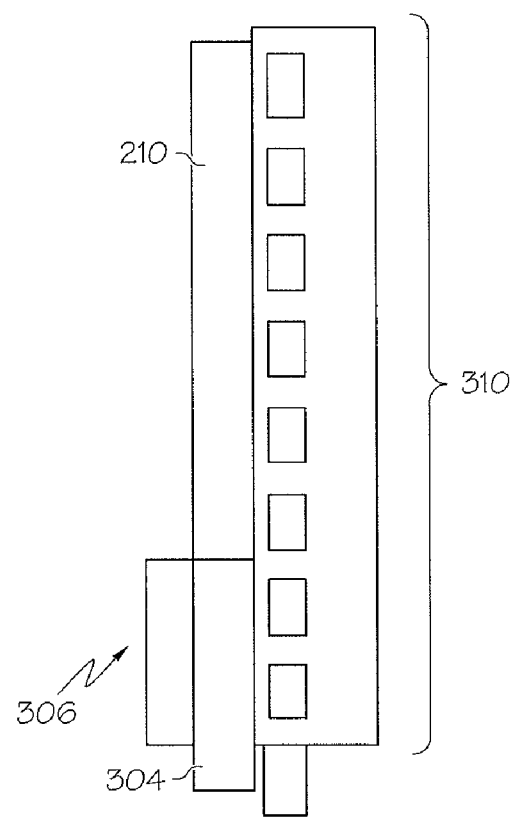

FIGS. 3D and 3E are opposite ends of front panel 152. FIG. 3D shows a first flow path end that mates with first sidewall 154. The first flow path end includes formed therein a set of first flow path openings 312 configured to mate with corresponding openings in the first sidewall 154, collectively forming part of the first flow path. FIG. 3E shows a second flow path end that includes openings 310, similar to openings 312, but which form part of the second flow path and are configured to mate with second sidewall 158.

Figure 4A:
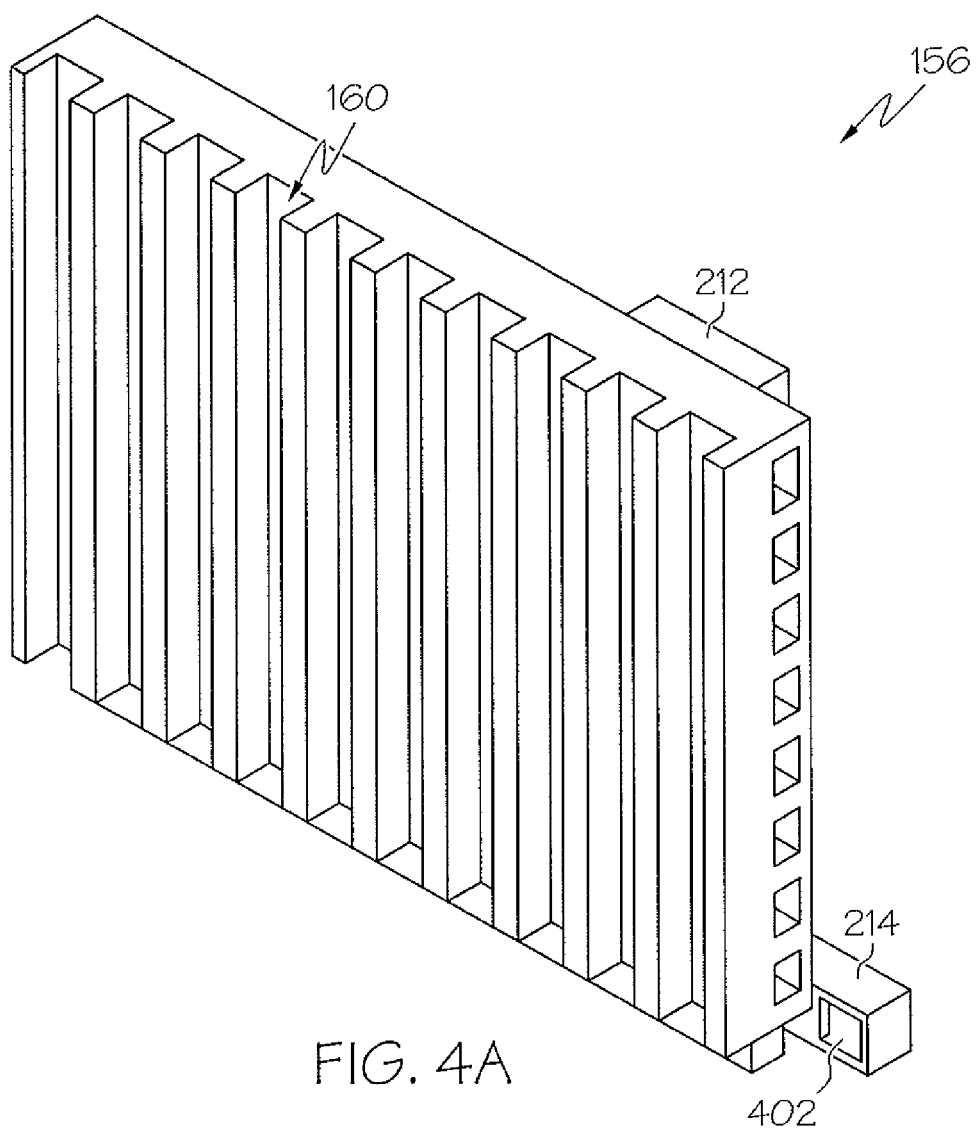
FIGS. 4A-4E are views of a rear wall of the card cage of FIG. 1.

FIGS. 4A-4E show different views of an embodiment of rear wall 156, which is also made of aluminum in the present embodiment. FIG. 4A is a view of rear wall 156 from a perspective internal to card cage 150. Card slots 160 are formed in rear wall 156 to accommodate insertion of electronics cards, and corresponding to the card slots in front wall 152. Portions of the collector manifold 212 and return channel 214 are also shown. Formed within the return channel is an opening 402 which mates with a portion of the return channel formed in bottom of second sidewall 158.

Figure 4B:
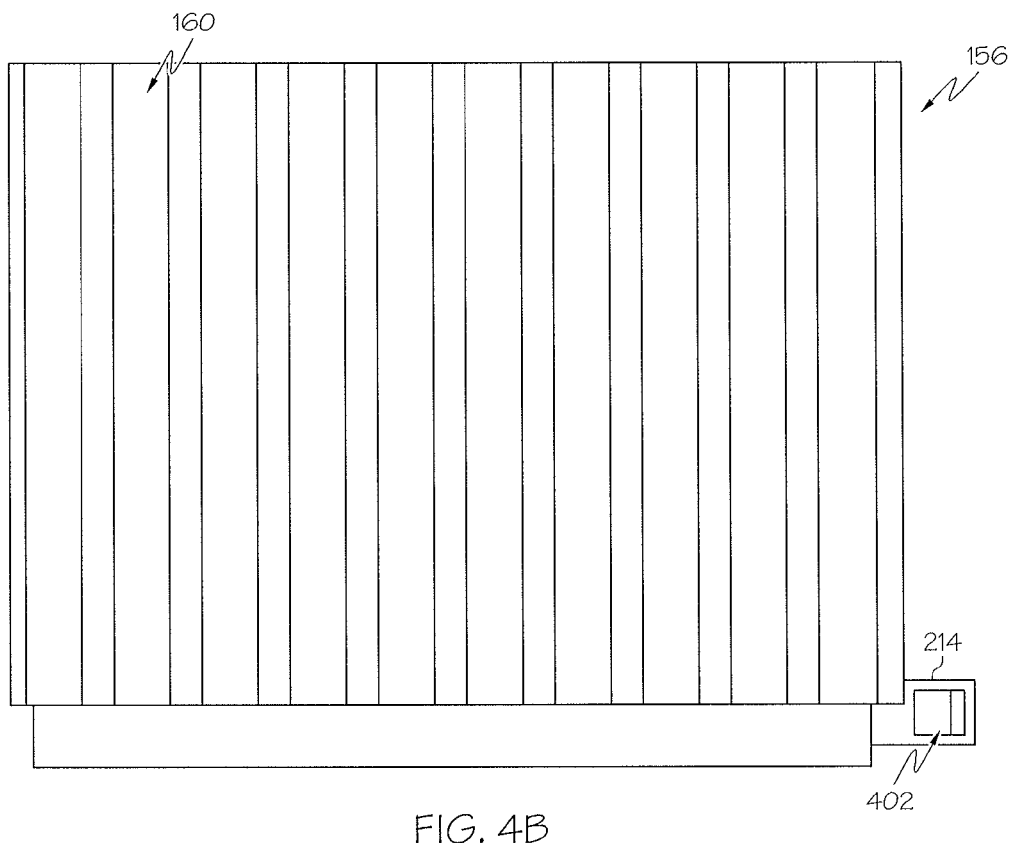

FIG. 4B is a front view of rear wall 156, again from a perspective internal to the card cage 150. Once again, the card slots 160 are visible. And a portion of the return channel 214 and opening 402 formed therein are shown.

Figure 4C:
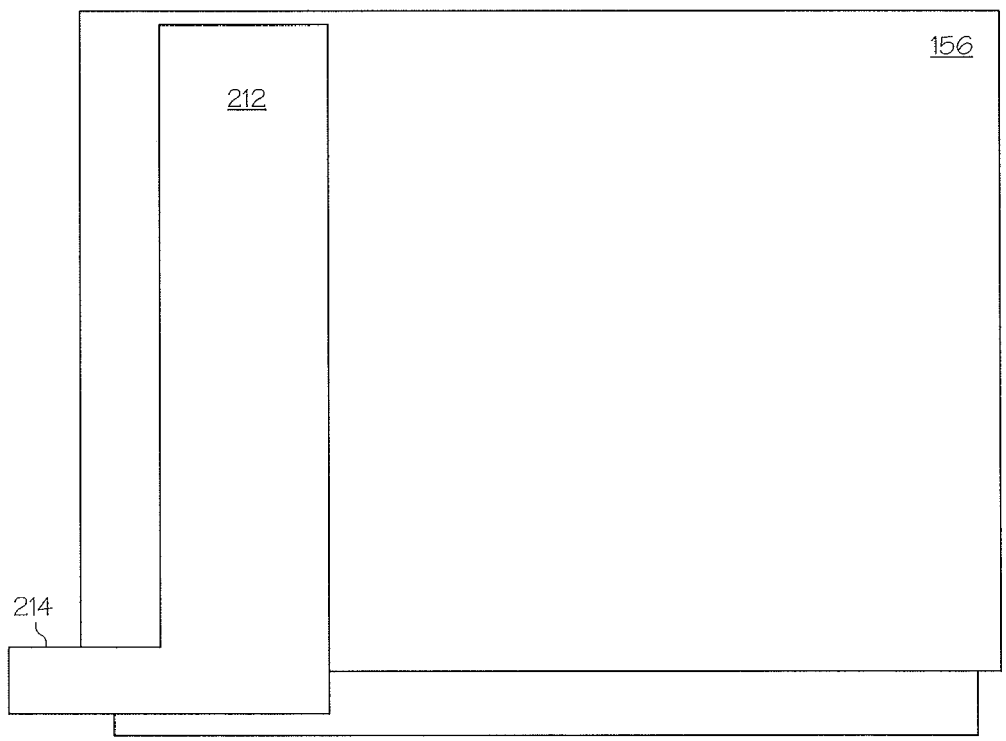

FIG. 4C is a rear view of rear panel 156. This view shows collector manifold 212 and a portion of return channel 214. Collector manifold 212 extends a substantial height of rear wall 156 to accommodate the several parallel channels in each of the first and second flow paths, which extend to about the same height as collector manifold 212.

Figure 4D:
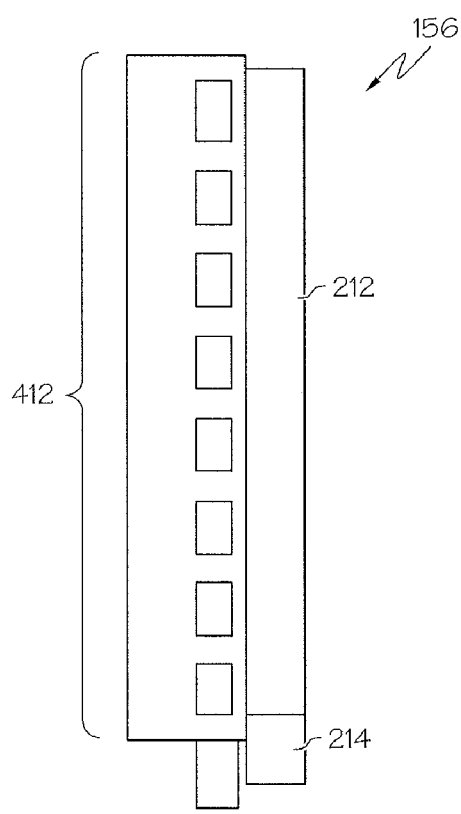
Figure 4E:
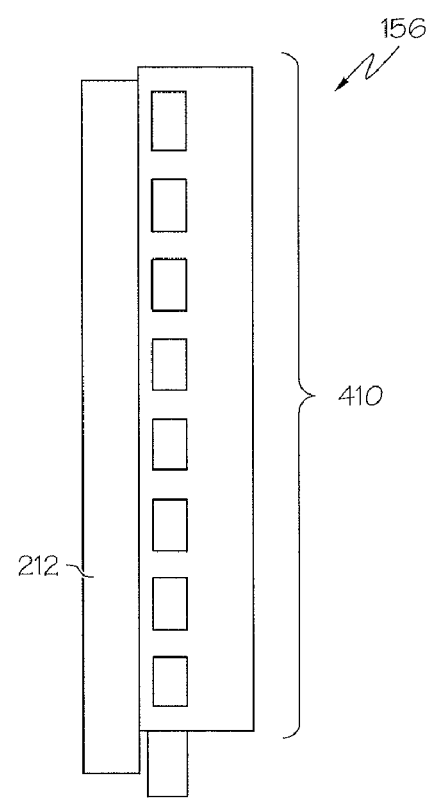

FIGS. 4D and 4E are opposite ends of rear panel 156. FIG. 4D is a second flow path end that mates with second sidewall 158. The second flow path end includes formed therein a set of second flow path openings 412 configured to mate with corresponding openings in second sidewall 158, collectively forming part of the second flow path.

FIG. 4E includes the openings 410, similar to openings 412, but which form part of the first flow path and are configured to mate with sidewall 154. Here again, the first and second flow paths each include eight parallel channels.

FIGS. 5A-5D show different views of an embodiment of second sidewall 158, which is also made of aluminum in the present embodiment. Second sidewall 158 and first sidewall 154 are substantially mirror images of each other, except second sidewall 158 includes portions of return channel 214 in this embodiment, which are not included in first sidewall 154. An opening 512 of return channel 214 is shown. Opening 512 mates with opening 308 in FIG. 3C to discharge the liquid via outlet 106. A set of connection sockets 502 are formed on an exterior face 500 of second sidewall 158. The five connection sockets 502 are configured to receive screws used to secure the cover plate 112 (see FIG. 1) to an external side of sidewall 158 and CCA 100.

Figure 5A:
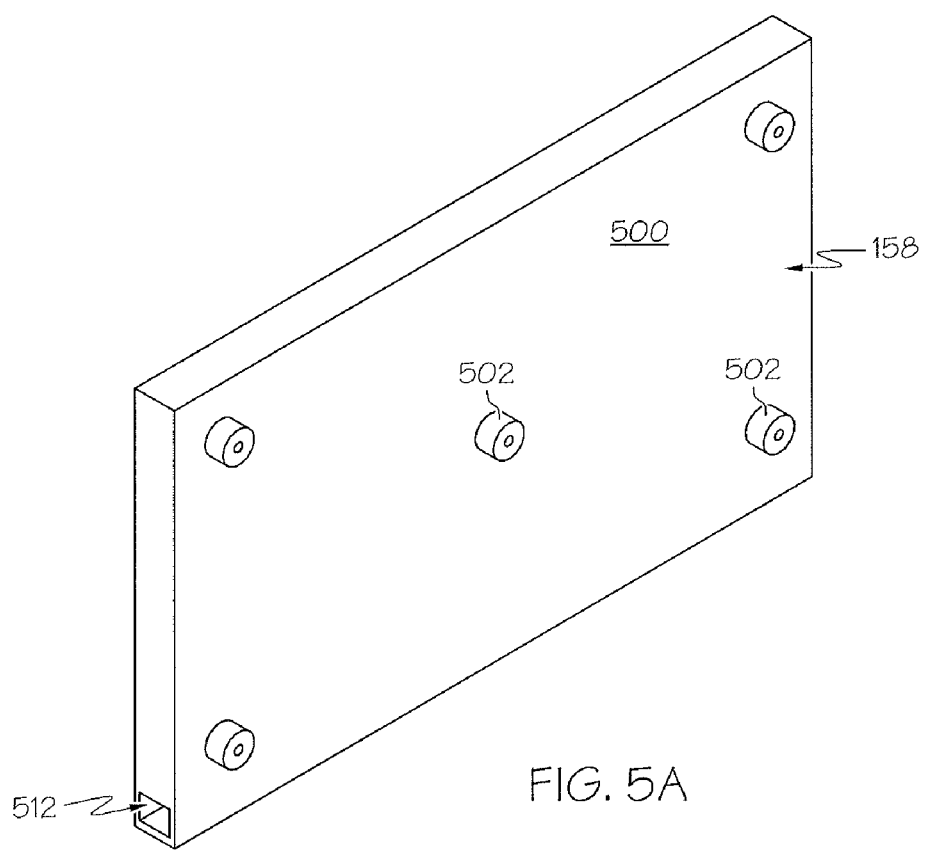
FIGS. 5A-5D are views of a sidewall of the card cage of FIG. 1.
Figure 5B:
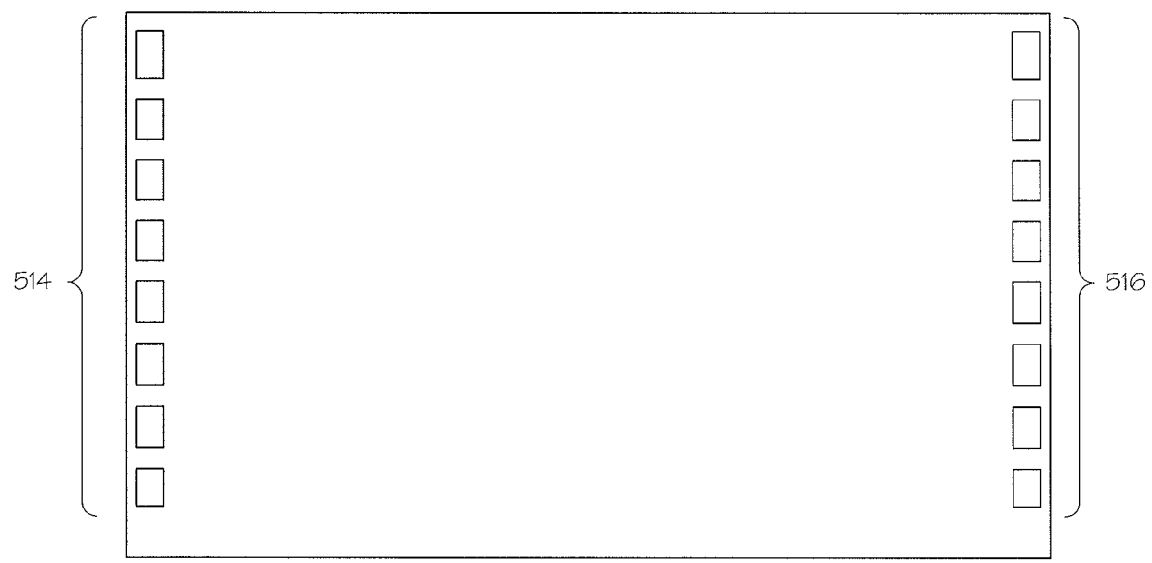

FIG. 5B is a view of second sidewall 158 from a perspective internal to card cage 150. In this embodiment, the second flow path is formed in second sidewall 158. The second flow path includes eight parallel fluid channels, as demonstrate by the either openings 514 and 516 on each side of second sidewall 158. Openings 514 are configured to mate with openings 412 of rear wall 156 (see FIG. 4D). Similarly, openings 516 are configured to mate with openings 310 of front wall 152 (see FIG. 3E). The same multi-channel arrangement exists in first sidewall 154 for the first flow path.

Figure 5C:
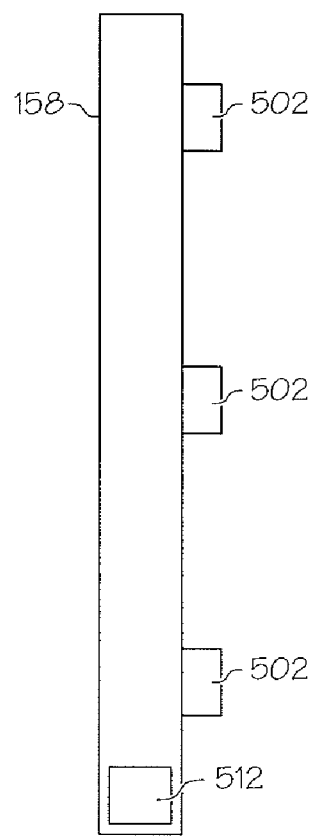
Figure 5D:
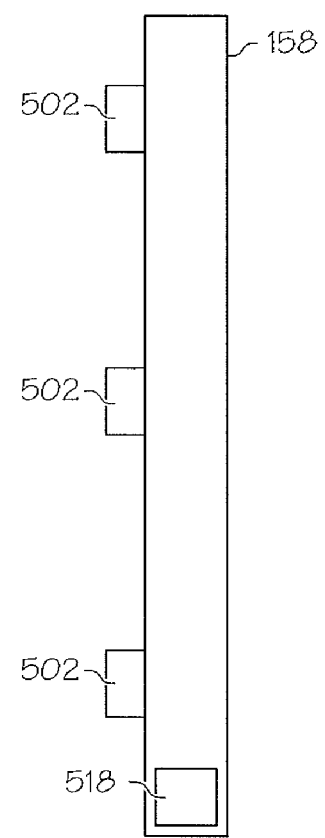

FIGS. 5C and 5D are opposite ends of second sidewall 158. FIG. 5C is a front wall end that mates with front wall 152. The front wall end includes return channel opening 512 configured to mate with return channel opening 308 in FIG. 3C of front wall 152. A side view of connection sockets 502 is also visible in FIGS. 5C and 5D.

FIG. 5D is a rear wall end that mates with rear wall 156. The rear wall end includes return channel opening 518 configured to mate with return channel opening 402 in FIG. 4A of rear wall 156.

Figure 6:
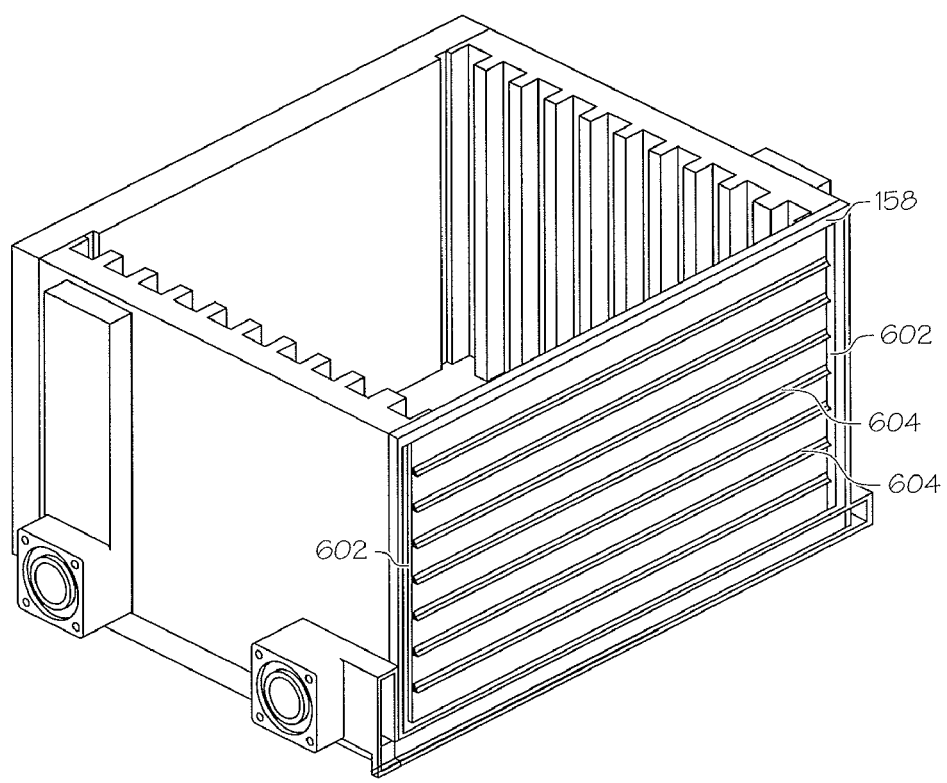
FIG. 6 is a perspective view of the card cage of FIG. 1 showing folded fin stock and machined fins in the fluid channels.

FIG. 6 is a view of card cage 150 that shows the internal structure of second sidewall 158, in this embodiment. Here fin stocks 602 and folded fins 604 are included to enhance thermal performance. These can be optionally included.

Figure 7:
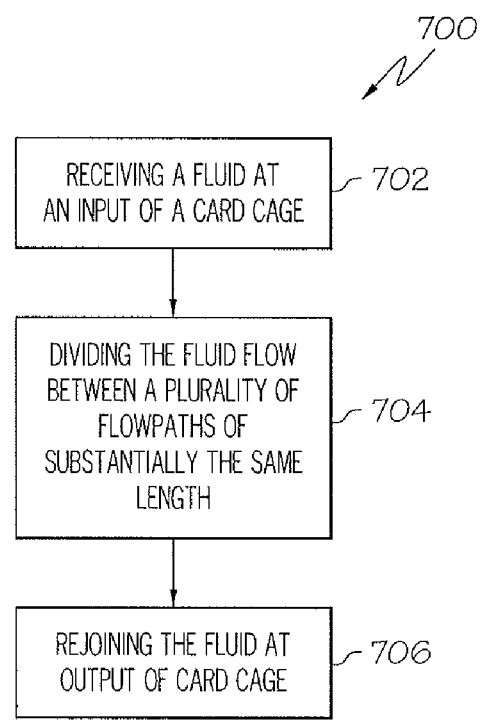
FIG. 7 is a flow diagram embodiment of a method for cooling a card cage in accordance with aspects of the present invention.

FIG. 7 is a flow diagram 700 depicting an embodiment of a method for cooling a card cage in accordance with aspects of the present invention. In accordance with the method, step 702 includes receiving a fluid at an input of a card cage. Step 704 includes dividing and flowing the fluid between a first flow path and a second flow path having substantially the same length. At least a portion of the first flow path can be formed in a first wall from the set of walls and at least a portion of the second flow path can formed in a second wall from the set of walls. The method then includes, in step 706, recombining and outputting the fluid at an output of the card cage.

As demonstrated in the flow path embodiments above, a plurality of flow paths can be formed in the walls of a card cage. The flow paths can be independent of each other, while still having substantially the same length. Each flow path can be split into multiple channels extending through the sidewalls to reduce the pressure drop. As an example, simulations have shown that the pressure drop through a HPLP liquid cooled card cage described above is 1/10 of the pressure drop through a similar performing commonly designed card cage.

Due to low flow resistance and low pressure drop, there are higher flow rates through the HPLP card cage, when compared to a conventional liquid cooled card cage. Higher coolant flow rate through HPLP card cage improves the heat transfer and reduces the required temperature gradient to transfer heat load to the card cage sidewalls. Simulations and tests of the above embodiment of an HPLP card cage have shown that for heat loads as high as 100 Watts (W) per CCA, the card cage sidewall temperature can be maintained as low as 60° C. using flow rates as small as 0.4 gpm and pressure drops as low as 1.2 psi. As an example, with the above HPLP card cage, a 1030 W heat load (100 W/CCA) and 0.37 gpm flow rate at 36° C. has a maximum resultant card cage sidewall temperature of 56° C. If a large number of smaller channels are used, performance can be improved at the expense of pressure drop. As a result, the solution can be optimized for the application; the HPLP card cage allows a lower temperature rise at the same pressure drop, or a lower pressure drop at the same temperature rise, as compared to a conventional liquid cooled card cage.

This illuminates the another advantage of HPLP card cage, which includes maintaining a lower temperature at the card cage sidewalls using the same liquid pump as a commonly designed card cage. In other words, a smaller pump is required for an HPLP card cage in accordance with this disclosure to achieve the same performance as commonly designed liquid cooled card cage, due to lower pressure drop through the disclosed HPLP card cage.

The HPLP card cage embodiments can include various numbers of CCAs in top load or side load orientations in various chassis form factors, such as the well known ATR form factor. The connections from the card cage to liquid inlet and outlet connectors can be modular and can be modified easily to change the location of the card cage within the chassis. The cards can also be oriented in different ways, e.g. from side-to-side.

Also, the illustrative embodiments disclose the flow of a coolant liquid through the parallel flow paths, in other embodiments a gas (or combination of gases) could be used, e.g., air or an inert gas. And the flow paths and fluid channels may be formed in any of a variety of manners, including those known in the art. The card cage can comprise at least one of embedded tubing, extruded channels, etched channels, machined channels, machined fins and folded fins formed within the first flow path and the second flow path. For example, the walls of the card cage with channels formed therein could be made by die-casting or by extrusion in a solid wall. The card cage can be made of any material, including composites, typically used in the art for such purposes, and is not limited by this disclosure.

Thus advantages of an HPLP card cage in accordance with this disclosure, versus a commonly designed liquid cooled card cage, can include the following: (1) lower flow resistance through the HPLP card cage; (2) lower temperature gradient from the CCA to the card cage sidewalls for the HPLP card cage, due to higher fluid flow rate; (3) better energy efficiency due to lower power requirement for the liquid pump for the HPLP card cage; (4) capability of removing higher heat loads due to lower temperature gradient for the HPLP card cage; (5) easy location of liquid outlet point due to the flexibility in positioning the return channel; and (6) top or side load orientations with various CCA numbers and various form factors can be achieved with minimum modifications.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A card cage configured to hold a set of electronics cards, the card cage comprising:
    a set of walls, the set of walls having an input configured to receive a fluid and an output configured as a fluid exit;
    a set of flow paths formed in the set of walls to enable a fluid to flow therein, the set of flow paths including:
        a first flow path formed between the input and the output; and
        a second flow path formed between the input and the output,
    wherein the first flow path and the second flow path are substantially the same length.

2. The card cage of claim 1, wherein the first flow path and the second flow path are formed to cause substantially the same pressure drop when the fluid is flowed therein.

3. The card cage of claim 1, wherein the first flow path and the second flow path form parallel fluid paths.

4. The card cage of claim 1, wherein the first flow path and the second flow path each comprise multiple channels.

5. The card cage of claim 1, wherein the card cage is a high performance, low pressure drop liquid cooled card cage.

6. The card cage of claim 1, further comprising:
    a return channel formed between the output and an outlet.

7. The card cage of claim 1, wherein a supply manifold is formed at the input.

8. The card cage of claim 7, wherein the supply manifold is configured to substantially equally divide the fluid between the first flow path and the second flow path.

9. The card cage of claim 1, wherein a collector manifold is formed at the output.

10. The card cage of claim 1, wherein the set of walls is configured to couple to a motherboard comprising a set of card connectors configured to mate with the set of electronics cards.

11. The card cage of claim 1, wherein the first fluid flow path and the second fluid flow path each extend through a plurality of walls from the set of walls.

12. The card cage of claim 1, wherein the fluid is chosen from a group comprising air, inert gas, and a coolant liquid.

13. The card cage of claim 1, further comprising at least one of embedded tubing, extruded channels, etched channels, machined channels, machined fins and folded fins formed within the first flow path and the second flow path.

14. A high performance, low pressure drop liquid cooled card cage comprising:
    a set of walls configured to form an enclosure;
    an input and an output formed in at least one wall from the set of walls;
    a motherboard including a set of card connectors configured to engage electronics cards, the motherboard and set of walls arranged to maintain the electronics cards within the enclosure; and
    a set of flow paths formed in the set of walls, the set of flow paths including:
        a first flow path formed between the input and the output, the first flow path disposed in parallel with the card connectors; and
        a second flow path formed between the input and the output, the second flow path disposed in parallel with the card connectors,
    wherein the first flow path and the second flow path are substantially the same length and are formed such that a liquid flowing therein experiences substantially the same pressure drop in the first flow path as it does in the second flow path.

15. The card cage of claim 14, wherein the first flow path and the second flow path each comprise multiple parallel channels.

16. The card cage of claim 14, further comprising:
    a return channel formed between the output and an outlet.

17. The card cage of claim 14, wherein a supply manifold is formed at the input.

18. The card cage of claim 17, wherein the supply manifold is configured to substantially equally divide the liquid between the first flow path and the second flow path.

19. The card cage of claim 14, wherein a collector manifold is formed at the output.

20. The card cage of claim 14, further comprising at least one of embedded tubing, extruded channels, etched channels, machined channels, machined fins and folded fins within the first flow path and the second flow path.

21. The card cage of claim 14, wherein the liquid is chosen from a group comprising water, glycol, polyalphaolefin, light mineral oils, fluorochemicals, high flash-point fuels, or some combination thereof.

22. The card cage of claim 14, wherein the set of walls includes four walls and the first flow path and the second flow path are each formed within at least two parallel sidewalls from the four walls.

23. A method of cooling a card cage comprising a set of walls forming an enclosure, the method comprising:
    receiving a fluid at an input;
    dividing and flowing the fluid between a first flow path and a second flow path having substantially the same length, wherein the first flow path is formed between an input and an output formed in the set of walls and the second flow path is also formed between the input and the output formed in the set of walls; and
    recombining and outputting the fluid at the output.

24. The method of claim 23 wherein the first flow path and the second flow path form parallel fluid paths.

25. The method of claim 23 further comprising maintaining substantially the same pressure drop in the first flow path and the second flow path.

26. The method of claim 23, wherein the first flow path and the second flow path each comprise multiple channels and the method further comprises dividing the fluid in the first flow path among the first flow path multiple channels and dividing the fluid in the second flow path among the second flow path multiple flow paths.

27. The method of claim 23, wherein the fluid is chosen from a group comprising air, inert gas, and a coolant liquid.

28. The method of claim 23, further comprising providing at least one of embedded tubing, extruded channels, etched channels, machined channels, machined fins and folded fins within the first flow path and the second flow path.

* * * * *